United States Patent [19]
Fukunaga et al.

[11] Patent Number: 5,394,425
[45] Date of Patent: Feb. 28, 1995

[54] METHOD OF MANUFACTURING A SEMICONDUCTOR LASER DEVICE

[75] Inventors: Hideki Fukunaga; Nobuaki Ueki; Hiromi Otoma; Hideo Nakayama, all of Kanagawa, Japan

[73] Assignee: Fuji Xerox Co., Ltd., Tokyo, Japan

[21] Appl. No.: 201,342

[22] Filed: Feb. 24, 1994

[30] Foreign Application Priority Data

Feb. 25, 1993 [JP] Japan .................................. 5-037013

[51] Int. Cl.$^6$ .............................................. H01S 3/19
[52] U.S. Cl. ........................................ 372/46; 372/45; 437/129
[58] Field of Search ........................... 372/46, 45, 44; 437/129

[56] References Cited

U.S. PATENT DOCUMENTS 5,164,797 11/1992 Thornton .................... 372/46

FOREIGN PATENT DOCUMENTS 0012787 1/1980 Japan ...................... 372/46
0119886 7/1984 Japan ...................... 372/46
0198785 11/1984 Japan ...................... 372/46

OTHER PUBLICATIONS

"Low threshold planar buried heterostructure lasers fabricated by impurity-induced disordering", R. L. Thornton, et al., Appl. Phys. Lett 47(12):1239–1241, Dec. 1985.

"Low-threshold high-efficiency high-yield impurity-induced layer disordering laser by self-aligned Si–Zn diffusion", W. X. Zou, et al., Appl. Phys. Lett. 57(24):2534–2536, Dec. 1990.

Primary Examiner—Georgia Y. Epps
Attorney, Agent, or Firm—Finnegan, Henderson, Farabow, Garrett & Dunner

[57] ABSTRACT

The method applies to manufacture of a semiconductor laser device which comprises a semiconductor substrate and a plurality of semiconductor layers piled sequentially one on top of another on the semiconductor substrate, the semiconductor layers including at least a first clad layer; an active layer interposed between a pair of optical waveguide layers, and a second clad layer. In the present manufacturing method, a first impurity diffusion source film is applied on top of the semiconductor layers, an insulation film is applied on top of the first impurity diffusion source film, two layers consisting of the first impurity diffusion source film and insulation film are removed respectively into a stripe shape except for the areas of the semiconductor layers in which impurities are to be diffused, a diffusion protect film to be etched selectively with respect to the insulation film is formed on the surfaces of the semiconductor layers and two layers, an impurity is thermally diffused from the first impurity diffusion source film, a diffusion protect film is etched selectively with respect to the insulation film, and a second impurity is diffused with the insulation film as a mask.

8 Claims, 11 Drawing Sheets

METHOD OF MANUFACTURING A SEMICONDUCTOR LASER DEVICE

BACKGROUND OF THE INVENTION

The present invention relates to a method of manufacturing a buried heterostructure (abbreviated as "BH") semiconductor laser device which uses layer disordering due to impurity diffusion.

Conventionally, there are known various semiconductor laser devices and one of them is a BH semiconductor laser device using layer disordering due to impurity diffusion.

Description will be given below of an example of a conventional method of manufacturing a BH semiconductor laser using layer disordering due to impurity diffusion with reference to FIGS. 8 to 11. This manufacturing method is proposed by the present applicant and is applied for patent as Japanese Patent Application No. Hei. 4-206,465.

In the conventional method, at first, on an n-type GaAs substrate 1, a clad layer 2 formed of Se doped $Al_{0.6}Ga_{0.4}As$ and having a thickness of 1 μm, an optical waveguide layer 3 formed of undoped $Al_{0.3}Ga_{0.7}As$ and having a thickness of 0.1 μm, a quantum well active layer 4 formed of undoped GaAs and having a thickness of 0.01 μm, an optical waveguide layer 3 of undoped $Al_{0.3}Ga_{0.7}As$ and having a thickness of 0.1 μm (In the drawings, the optical waveguide layer 3 and the active layer 4 are shown as the same layer.), a clad layer 5 formed of Mg doped $Al_{0.6}Ga_{0.4}As$ and having a thickness of 1 μm, and a contact layer 6 formed of Mg doped GaAs and having a thickness of 0.1 μm are put one on top of one another sequentially according to the MOCVD method. Then, as shown in FIG. 8(a), an Si film 7 having a thickness of 10 nm is deposited as an impurity diffusion source film on top of the contact layer 6 by use of an electron-beam evaporation, and after then, as shown in FIG. 8(b), an $SiO_2$ film 8 having a thickness of 50 nm as an insulation film and an Si film 9 having a thickness of 10 nm as an etching preventive film are sequentially deposited on top of the Si film 7 by use of an electron-beam evaporation. The Si film 9 is provided as an etching preventive film for the $SiO_2$ film 8 in order to etch and remove a diffusion protect film 10 (which will be described later) formed of $SiO_2$ selectively from the $SiO_2$ film 8.

Then, as shown in FIG. 8(c), a resist 13 is put on top of the Si film 9 and a stripe-shaped window having a width of 5 μm is formed in the resist 13 in a machining step using photolithography. And the resist 13 is used as a mask to remove the Si film 7 serving as the impurity diffusion source film, the $SiO_2$ film 8 serving as the insulation film, and the Si film 9 serving as the etching preventive film by means of dry etching, thereby forming a stripe-shaped window as shown in FIG. 9(a). After then, as shown in FIG. 9(b), the resist 13 is removed by use of acetone and the portion from which the resist 13 has been removed is rinsed by use of isopropyl alcohol and is then washed by pure water. Then, as shown in FIG. 9(c), the whole surface of the thus formed window is covered with an $SiO_2$ film 10 which is a diffusion protect film of 50 nm in thickness. The thus formed layer assembly is then sealed into a quarts tube together with arsenic and, after then, the assembly is thermally treated for 2 hours at a temperature of 850° C. in an electric furnace to diffuse Si in such a manner as shown in FIG. 10(a), thereby forming an Si diffusion area 14. Next, as shown in FIG. 10(b), after thermally treated, the $SiO_2$ film 10 is etched by means of buffered fluoric acid. In this case, since the Si film has an etching rate which is one-tenth or less than that of the $SiO_2$ film, the $SiO_2$ film 10 serving as the diffusion protect film can be removed almost selectively. After then, the assembly is sealed into the quarts tube together with zinc and arsenic and is thermally treated for 20 minutes at a temperature of 550° C. and, as shown in FIG. 10(c), the Si film 7, $SiO_2$ film 8 and Si film 9 are used as masks to diffuse Zn, thereby forming a Zn diffusion area 15. Next, as shown in FIG. 11, the Si film 7, $SiO_2$ film 8 and Si film 9 are used as current preventive layers to thereby vapor deposit a p-side electrode 11. Also, an n-side electrode 12 is vapor deposited on the n-type GaAs substrate 1 side.

According to a semiconductor laser having the structure shown in FIG. 11, contact between the GaAs contact layer 6 serving as the non-diffusion area of the impurity and the p-side electrode 11 can be achieved with high accuracy to thereby improve contact between the electrode and the semiconductor layer. Also, between the clad layer 5 and Si diffusion area 14 there is formed a pn junction which has a turn-on voltage greater than the active layer 4 in the active area, whereby the diffusion of a current in the lateral direction can be advantageously restricted.

In the above-mentioned conventional semiconductor laser manufacturing method, in order to selectively remove the $SiO_2$ film 10 serving as the diffusion protect film, the Si film 9 is disposed, as the etching preventive layer, on the $SiO_2$ film 8 serving as the insulation film. However, when the diffusion window is formed, if the resist 13 is applied directly onto the Si film 9 and the working step according to the photography is executed (see FIG. 8(c)), then the residual resist is easy to occur when the resist is peeled off and the residual resist attaches to the semiconductor laser device as an impurity because it is heated when the Si is diffused, thereby lowering the yield thereof. Although the reason of the occurrence of the residual resist is not known so far, such phenomenon has been confirmed from experiments. It seems that this is because there exists a strong chemical affinity between the Si film 9 and resist 13. Also, from the viewpoint of the manufacturing process as well, the Si film must be deposited twice (see FIGS. 8(a), (b)), which is troublesome. Also, the $SiO_2$ 8 is provided in order to prevent partially the inflow of a current from the electrode 11 when the semiconductor laser is driven, but the $SiO_2$ film raises a problem that it lowers the diffusion speed of the Si film 7 when the Si diffusion area 14 is formed.

SUMMARY OF THE INVENTION

In view of the above-mentioned conventional circumstances, it is an object of the invention to provide a method of manufacturing a BH semiconductor laser by removing a diffusion protect layer selectively with no use of an etching preventive layer. It is another object of the invention to provide a manufacturing method which is improved in the steps thereof. It is yet another object of the invention to provide a manufacturing method which can provide a fast Si diffusion speed when a light confining area is formed. It is still another object of the invention to provide a semiconductor laser which includes an insulation film having an improved etching resistant characteristic.

In attaining the above object, according to the invention, there is provided a method of manufacturing a semiconductor laser device formed by piling semiconductor layers one on top of another on a semiconductor substrate, the semiconductor layers including at least a first clad layer, an active layer interposed between a pair of optical waveguide layers, and a second clad layer, the method comprising the steps of: depositing a first impurity diffusion source film on top of the above semiconductor layers; depositing an insulation film on the first impurity diffusion source film; removing two layers consisting of the first impurity diffusion source film and the insulation film in a stripe shape except for the areas thereof in which impurities are to be diffused; forming a diffusion protect film on the surfaces of the semiconductor layers and the above two layers, the diffusion protect film being etched selectively with respect to the insulation film; diffusing an impurity thermally from the first impurity diffusion source film; etching the diffusion protect film selectively with respect to the insulation film; and diffusing a second impurity with the insulation film used as a mask.

According to the invention, before the first impurity is diffused, the first impurity diffusion source film and insulation film are deposited, these two layers are removed except for the areas thereof for diffusion of the first impurity, and the diffusion protect film to be etched selectively with respect to the insulation film is deposited on the whole surface of the impurity diffusion areas, before the first impurity is diffused selectively by means of a thermal treatment. After then, only the diffusion protect film is etched, the second impurity is selectively diffused with the insulation film used as a mask, and further the insulation film is also used as a current preventive layer.

According to the invention, the impurity diffusion is selectively executed by patterning the first impurity diffusion source film to thereby form an alloy area. Also, simultaneously with the patterning of the first impurity diffusion source film, the insulation film is patterned. Next, by use of the diffusion protective film to be selectively etched with respect to the insulation film, after diffusion of the first impurity, the diffusion protective film can be removed selectively and, with the insulation film as a mask, the second impurity can be selectively diffused in the other area than the first impurity diffusion area. Further, after diffusion of the second impurity, the insulation film can be used as a current preventive layer, which eliminates a working step of forming a new current preventive layer according to lithography.

The light confining area is an area in which Si is diffused, while the current confining area is an area in which Zn is diffused. The light confining area can confine light therein because the Si diffused area is alloy and thus has a low refractive index. The Zn diffusion area becomes a p-type layer due to the diffusion of Zn to thereby form a pn junction with an original n-type layer so that it can confine a current from the electrode 11 in the Zn diffusion area.

DETAILED DESCRIPTION OF THE PREFERRED EMBODIMENTS

Description will be given hereinbelow of the preferred embodiments of the invention with reference to the accompanying drawings.

Figure 1:
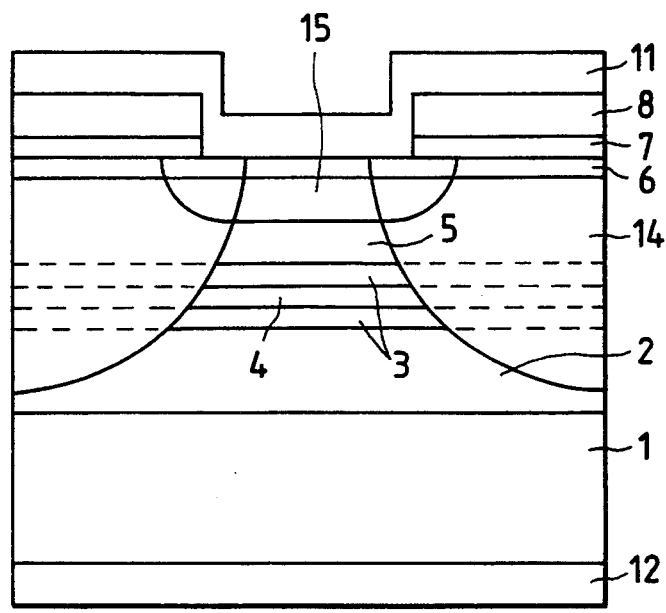
FIG. 1 is a section view of the structure of a semiconductor laser device obtained in a manufacturing method according to the invention.

In FIG. 1, there is shown an example of the structure of a semiconductor laser obtained by a first embodiment of a manufacturing method according to the invention. Also, in FIGS. 2 to 5, there are shown the manufacturing steps of a semiconductor laser device according to the first embodiment of the invention.

Figure 2A:
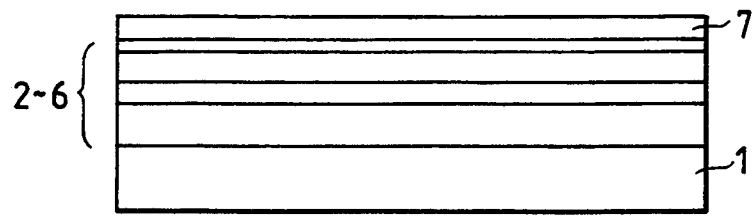
FIGS. 2(a), (b), (c) are section views of a first part of a first embodiment of a method of manufacturing a semiconductor laser device according to the invention.
Figure 2B:
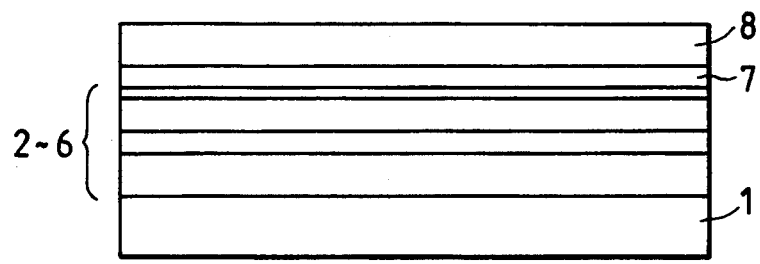

In the first embodiment, at first, on an n-type GaAs substrate 1, a clad layer 2 formed of Se doped $Al_{0.6}Ga_{0.4}As$ and having a thickness of 1 $\mu$m, an optical waveguide layer 3 formed of undoped $Al_{0.3}Ga_{0.7}As$ and having a thickness of 0.1 $\mu$m, a quantum well active layer 4 formed of undoped GaAs and having a thickness of 0.01 $\mu$m, an optical waveguide layer 3 formed of undoped $Al_{0.3}Ga_{0.7}As$ and having a thickness of 0.1 $\mu$m, a clad layer 5 formed of Mg doped $Al_{0.6}Ga_{0.4}As$ and having a thickness of 1 $\mu$m, and a contact layer 6 formed of Mg doped GaAs and having a thickness of 0.1 $\mu$m are sequentially piled one on top of another according to the MOCVD method. As shown in FIG. 2 (2), an Si film 7 having a thickness of 5 nm is deposited as an impurity diffusion source film on the above layers by use of an electron-beam evaporation. After then, as shown in FIG. 2(b), an $Si_3N_4$ film 8 having a thickness of 70 nm is applied as an insulation film on the top of the Si film 7 by means of RF spattering.

Figure 5:
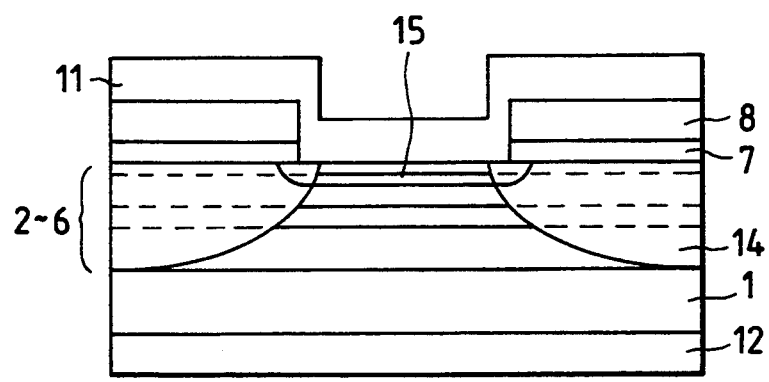
FIG. 5 is a section view of a fourth part of the first embodiment according to the invention.
Figure 2C:
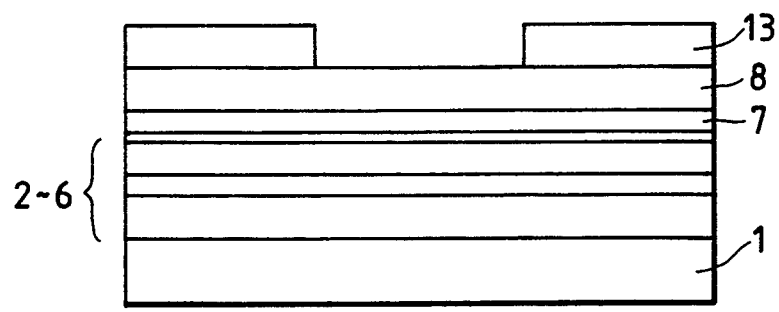
Figure 3A:
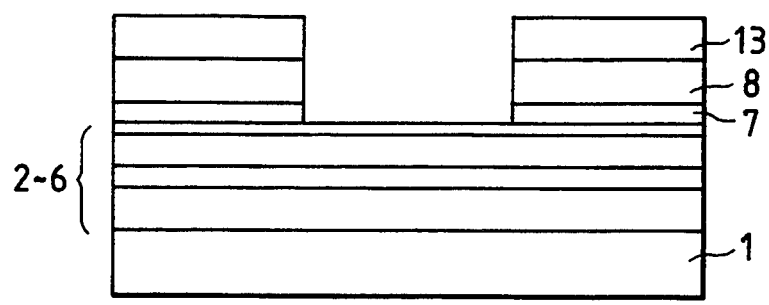
FIGS. 3(a), (b), (c) are section views of a second part of the first embodiment according to the invention.
Figure 3B:
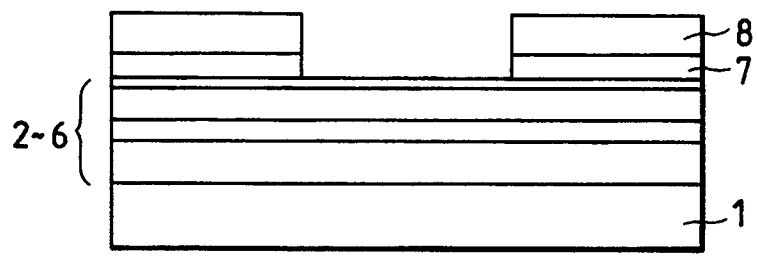
Figure 3C:
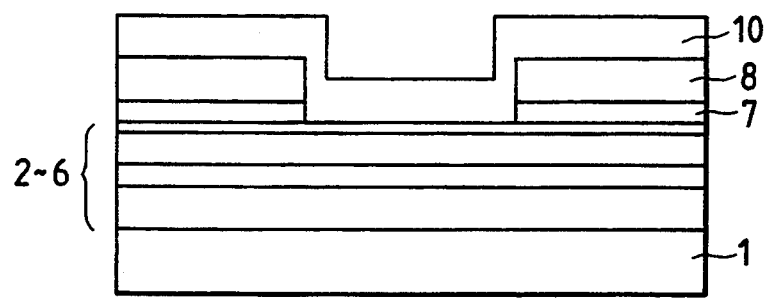
Figure 4A:
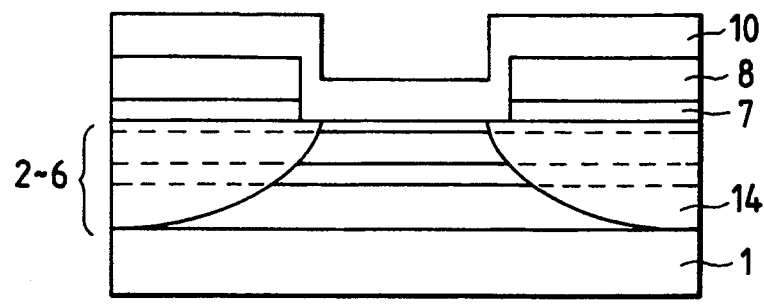
FIGS. 4(a), (b), (c) are section views of a third part of the first embodiment according to the invention.
Figure 4B:
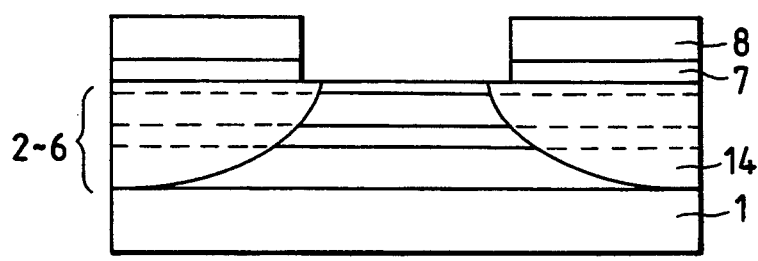
Figure 4C:
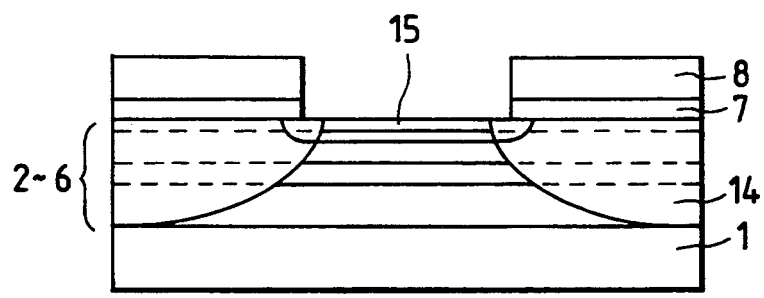

On the top of the $Si_3N_4$ film 8, as shown in FIG. 2(c), a stripe-shaped window having a width of 5 $\mu$m is formed in a resist 13 in a working step which uses photolithography and, with the resist 13 used as a mask, the Si film 7 serving as an impurity diffusion source film and the $Si_3N_4$ film 8 serving as an insulation film are removed by means of etching, thereby opening up a stripe-shaped window as shown in FIG. 3(a). After then, as shown in FIG. 3(b), the resist 13 is removed by use of acetone. In this case, since the resist 13 is formed on the Si₃N₄ film 8 having weak contact with the resist 13, the resist 13 can be peeled off easily from the Si₃N₄ and any of the resist 13 can be left on the Si₃N₄. After then, the surface of the Si₃N₄ film 8 with the window is rinsed by isopropyl alcohol and washed by pure water and then, as shown in FIG. 3(c), is covered with an SiO₂ film 10 serving as a diffusion protect film and having a thickness of 50 nm. Then, after the thus formed layer assembly is sealed into a quarts tube together with arsenic, it is thermally treated for two hours at a temperature of 850° C. in an electric furnace to diffuse Si as shown in FIG. 4(a), thereby forming an Si diffusion area 14. Next, as shown in FIG. 4(b), after thermal treatment, the SiO₂ film 10 is etched by use of buffered fluoric acid. The etching speed of the Si₃N₄ film 8, after thermally treated, with respect to the buffered fluoric acid serving as an etchant is 150 Å/min. On the other hand, the etching speed of the SiO₂ after thermally treated is 720 Å/min. That is, the etching speed of the SiO₂ is about five times that of the Si₃N₄, so that the SiO₂ film 10 serving as a diffusion protect film can be removed almost selectively. After then, the layer assembly is sealed into a quarts tube together with zinc and arsenic and is thermally treated for 20 minutes at a temperature of 550° C. to diffuse Zn with the Si film 7 and Si₃N₄ film 8 as masks, thereby forming a Zn diffusion area 15. Next, as shown in FIG. 5, with the Si film 7 and Si₃N₄ film 8 as current preventive layers, a p-side electrode 11 is vapor deposited. Also, an n-side electrode 12 is vapor deposited on the n-type GaAs substrate 1 side to thereby produce a semiconductor laser.

The semiconductor laser manufacturing method of the present invention can also be applied to other types of semiconductor structures than the structure shown in the above embodiment of the invention, for example, the present method can also be enforced even when the semiconductor structure includes other material system such as an AlGaInP alloy system, a GaInAsP alloy system, an AlInAsP alloy system and the like.

In the above embodiment, two layers consisting of the Si film 7 serving as an impurity diffusion source film and the Si₃N₄ film 8 serving as an insulation film are etched and removed with the resist 13 as a mask. Alternatively, however, the two layers can be removed by lifting off the two layers.

Figure 6A:
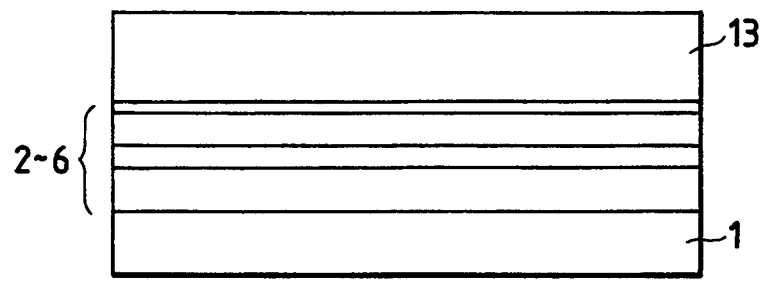
FIGS. 6(a), (b), (c) are section views of a first part of a second embodiment of a method of manufacturing a semiconductor laser device according to the invention.
Figure 6B:
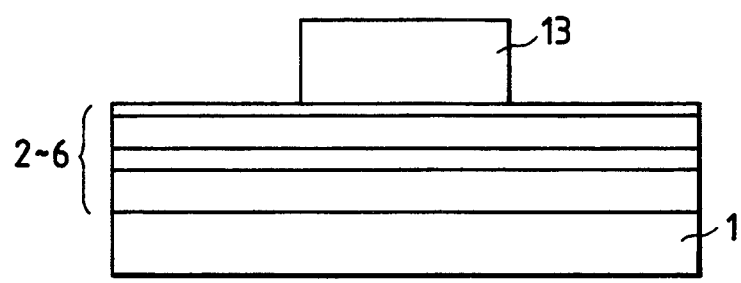
Figure 6C:
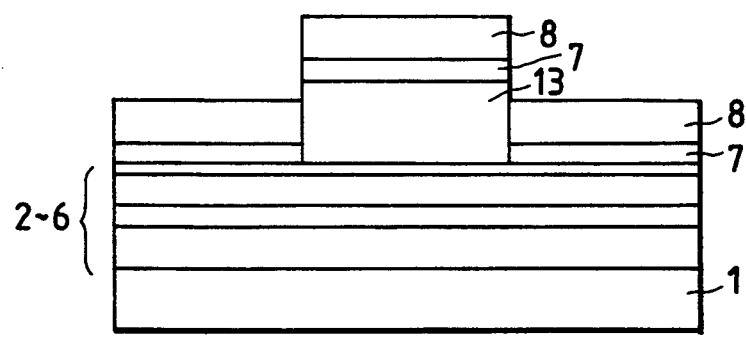

In other words, similarly to the above embodiment, after a crystal is grown according to the MOCVD method, as shown in FIG. 6(a), a resist 13 is deposited and, as shown in FIG. 6(b), a stripe-shaped resist 13 having a width of 5 μm is formed in a working step using lithography. Then, as shown in FIG. 6(c), on the stripe-shaped resist 13, there is applied, as an impurity diffusion source film, an Si film 7 having a thickness of 5 nm by use of an electron-beam evaporation. After then, as an insulation film, an Si₃N₄ film 8 having a thickness of 70 nm is applied onto the Si film 7 by means of RF spattering.

Figure 7A:
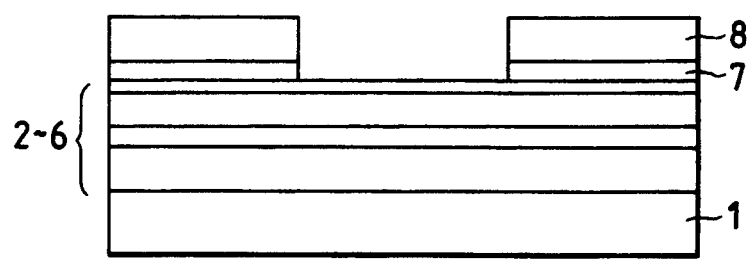
FIGS. 7(a), (b) are section views of a second part of the second embodiment according to the invention.
Figure 7B:
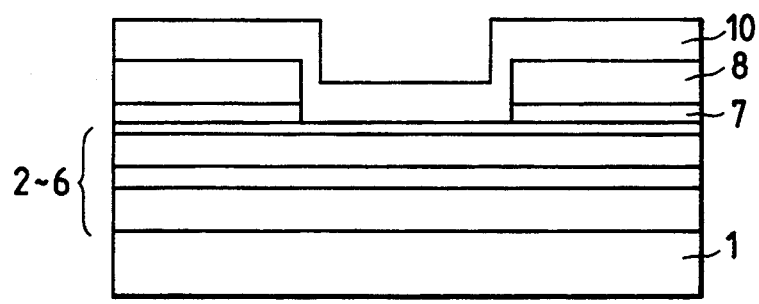
Figure 8A:
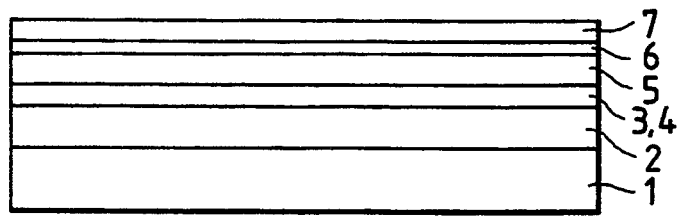
FIGS. 8(a), (b), (c) are section views of a first part of a conventional method of manufacturing a semiconductor laser.
Figure 8B:
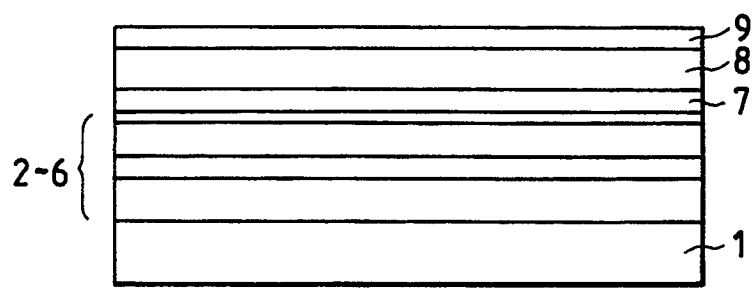
Figure 8C:
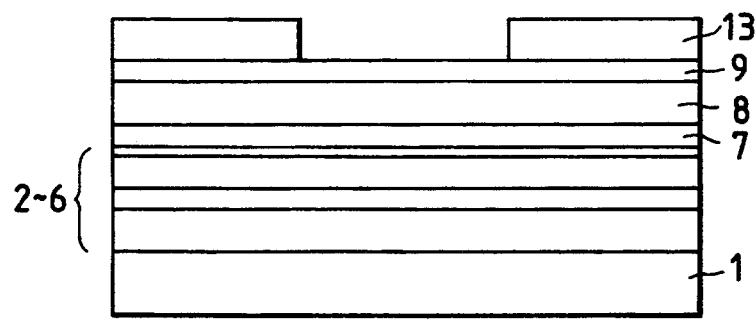
Figure 9A:
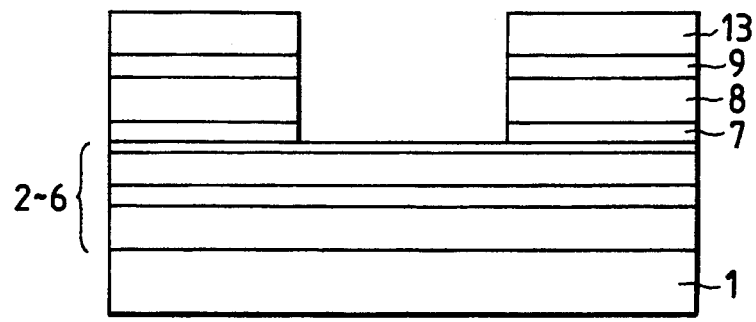
FIGS. 9(a), (b), (c) are section views of a second part of the conventional method of manufacturing a semiconductor laser.
Figure 9B:
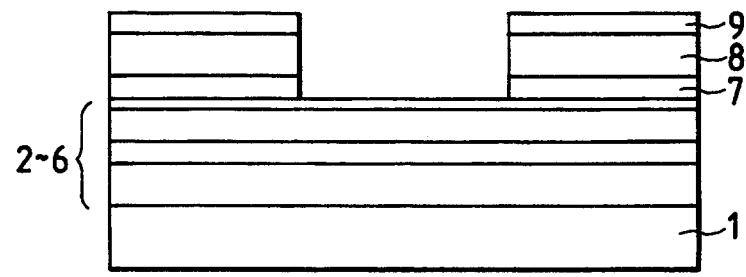
Figure 9C:
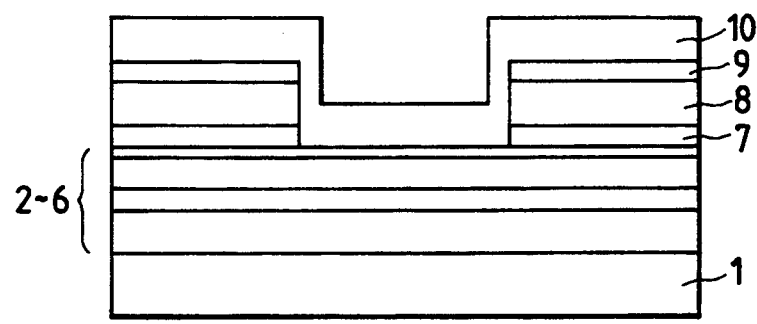
Figure 10A:
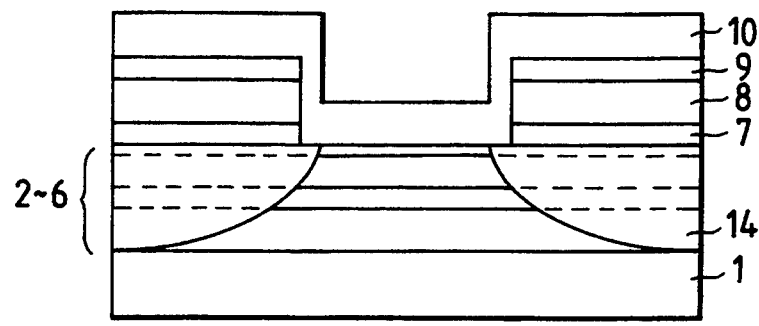
FIGS. 10(a), (b), (c) are section views of a third part of the conventional method of manufacturing a semiconductor laser.
Figure 10B:
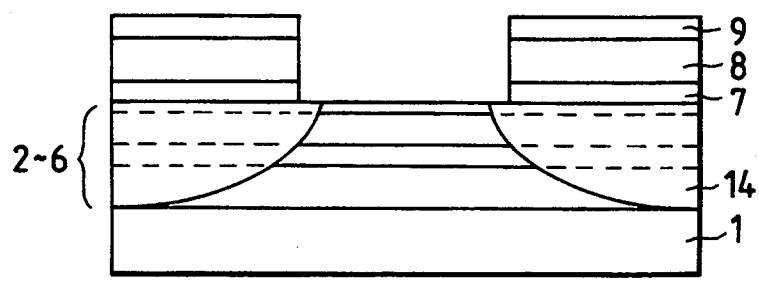
Figure 10C:
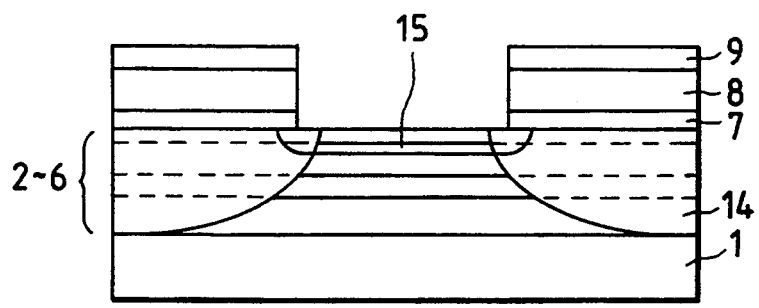
Figure 11:
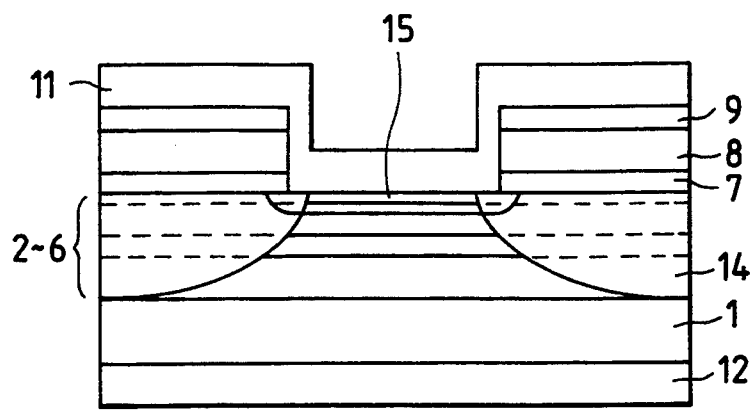
FIG. 11 is a section view of a fourth part of the conventional method of manufacturing a semiconductor laser.

Next, by removing the resist 13 by use of acetone, the Si film 7 serving as an impurity diffusion source film and the Si₃N₄ serving as an insulation film respectively on an area where an impurity is not diffused are lifted off and removed, thereby opening up a stripe-shaped window as shown in FIG. 7(a). After then, the thus formed layer assembly is rinsed by isopropyl and is washed by pure water. Next, the whole surface of the assembly is covered with an SiO₂ film 10 serving as a diffusion protect film and having a thickness of 50 nm.

Steps including a thermal treatment step and its following steps are similar to the above-mentioned embodiment and thus the description thereof is omitted here.

Figure 12:
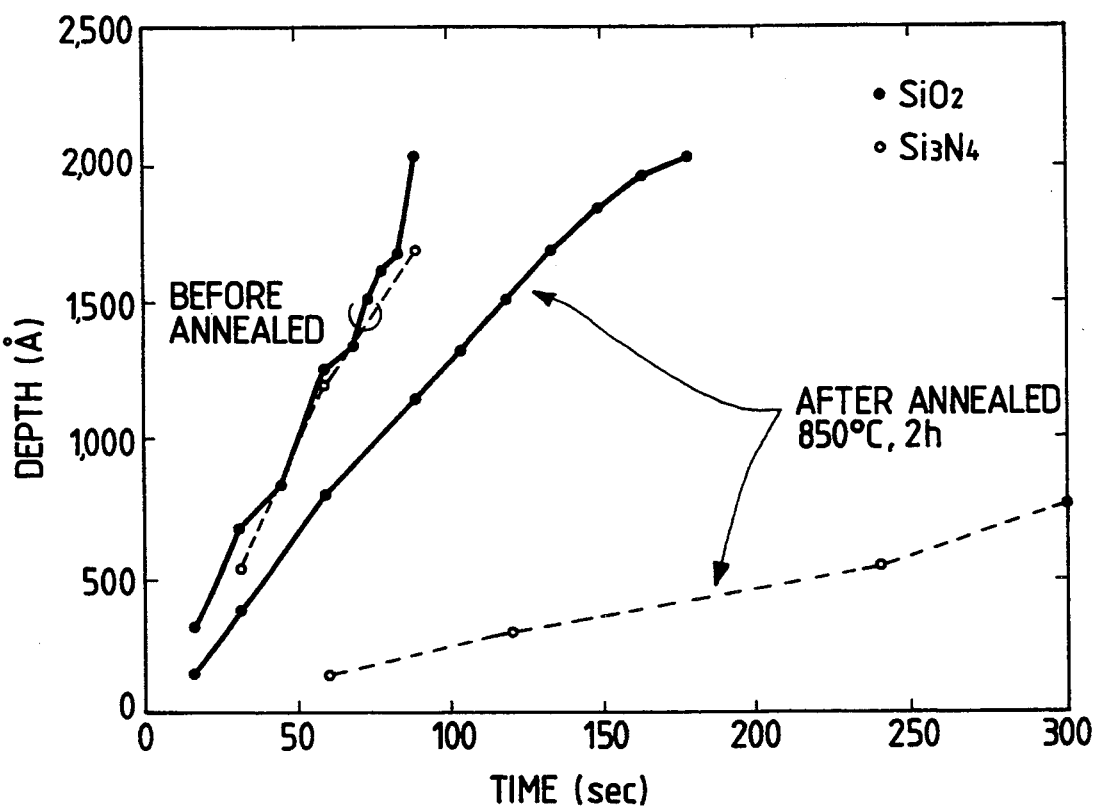
FIG. 12 shows etching rate of $SiO_2$ film and $Si_3N_4$ film.

Here, the present inventors checked how the etching speed of the Si₃N₄ film with respect to an etching solution (buffered fluoric acid) varies before and after it is thermally annealed. For reference, the thermal annealing, in the above embodiment, is set in the same condition as one employed when the diffusion area 14 is formed by means of the Si film 7. In other words, the inventors examined how the etching rate of the Si₃N₄ film varied before and after the Si₃N₄ film was formed on top of the GaAs substrate and was then heated for 2 hours at a temperature of 850° C. The results of the examination are shown in FIG. 12. In FIG. 12, the axis of abscissa represents an etching time (sec.) and the axis of ordinate expresses an etching depth (angstrom). In this figure, O (broken line) stands for the etching depth of the Si₃N₄ film before and after thermally annealed. For example, in the case when the etching time is 75 (sec.), the etching depth before thermally annealed is on the order of 1,450 Å, whereas the etching depth after thermally annealed is on the order of 200 Å, which shows that the etching rate varies to 200/1,450=0.14. On the other hand, for comparison with the above, similarly the SiO₂ film was also checked for its etching speed before and after thermally annealed. That is, a SiO₂ film was formed on the substrate and the SiO₂ film was checked how its etching rate varied before and after it was heated at a temperature of 850° C. for 2 hours. The results of the etching depth variations checked are shown in FIG. 12. In FIG. 12, ● (solid line) represents the etching depths of the SiO₂ film before and after thermally annealed. For example, in the case of an etching time of 75 (sec.), the etching depth before thermally annealed is on the order of 1,500 Å, whereas the etching depth after thermally annealed is on the order of 1,000 Å, which shows the etching rate thereof is 1,000/1,500=0.67. In both of the SiO₂ film and Si₃N₄ film, the etching depth is almost proportional to the etching time both before and after thermally annealed and also there is found few difference between the etching rates of the SiO₂ film and Si₃N₄ film before thermally annealed. This shows that the Si₃N₄ film provides a higher etching resistance to the buffered fluoric acid when thermally annealed. Therefore, in the present embodiment, when the Si$_{O4}$ film is used as the insulation film 8, a higher etching resistance can be obtained when compared with use of the SiO₂ film. This eliminates the need for provision of the Si film 9 which has been conventionally used as an etching preventive film, thereby being able to simplify the manufacturing process of the semiconductor laser.

Figure 13:
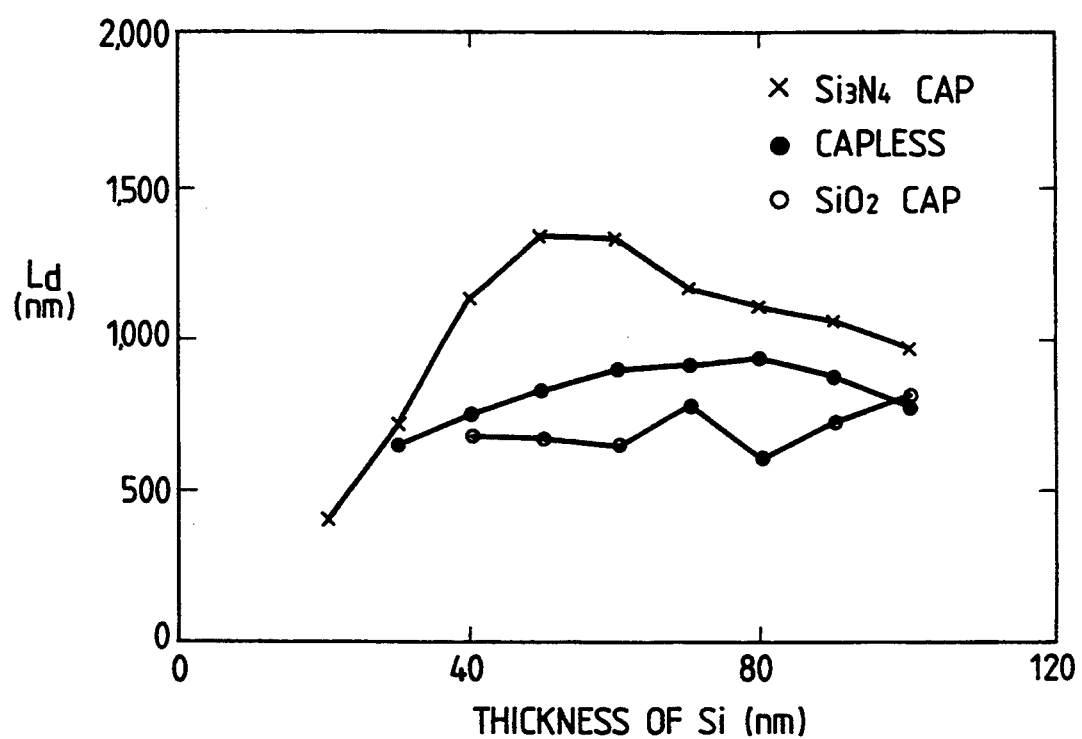
FIG. 13 shows diffusion distance of Si to the GaAs substrate.

Further, when the Si₃N₄ film was used as the insulation film 8, then there was confirmed an effect that the diffusion distance of the Si atoms of the Si film disposed just below the Si₃N₄ to the GaAs substrate was enhanced. That is, there were produced three kinds of devices when the Si film 9 was formed on top of the GaAs substrate as a diffusion source to the GaAs substrate and a Si₃N₄ was put on top of the Si film 9 as an insulation layer, when a SiO₂ film was put on top of the Si film 9 and when no insulation film was put on top of the Si film 9; and, when the thickness of the Si film (diffusion source) was varied under the thermally annealing condition of a temperature of 850° C. and a period of 2 hours (in a diffusion step), it was examined how the diffusion distance of Si to the GaAs substrate was changed. The results of the examination are shown in FIG. 13. In this figure, x represents the case when the $Si_3N_4$ was used. O stands for the case when the $SiO_2$ film was used, and ● expresses the case when no insulation film was used. It was found from FIG. 13 that a diffusion distance obtained when the $Si_3N_4$ film was used was longer when compared with diffusion distances respectively obtained when the $SiO_2$ was used and when no insulation film was used. In the case of the $Si_3N_4$ film, there was found a tendency that the diffusion distance once reached its peak when the thickness of the Si film was in the neighborhood of 700 Å and after then the diffusion distance was decreased little by little. Especially, it was found that, in an area in which the thickness of the Si film exceeds 30 nm, when the $Si_3N_4$ was used, the diffusion distance to the GaAs substrate was greater regardless of the thickness of the Si film. This means that the manufacturing process, that is, the time necessary for a step to diffuse Si to the GaAs substrate can be reduced. In the above experiment, although the thickness of the $Si_3N_4$ film was set for 700 Å and the thickness of the $SiO_2$ was set for 150 Å, even when thickness of the insulation films were respectively evaluated in the range of 100–1,000 Å, it was found that the etching depth did not change so much.

According to the invention, by using films differing greatly in the etching speed thereof with respect to the same etchant, as the insulation layer and diffusion protect film, the diffusion protect film can be removed selectively, so that the manufacturing process of the semiconductor laser can be simplified. Also, since an etching preventive film to be the cause for the residual resist is not formed, the lowered rate of yield can be avoided.

What is claimed is:

1. A method of manufacturing a semiconductor laser device which includes a semiconductor substrate and a plurality of semiconductor layers comprising at least a first clad layer, an active layer interposed between a pair of optical waveguide layers and a second clad layer piled sequentially one on top of another on the semiconductor substrate, said method comprising the steps of:
   applying a first impurity diffusion source film on top of said semiconductor layers;
   applying an insulation film on top of said first impurity diffusion source film;
   removing two layers consisting of said first impurity diffusion source film and said insulation film respectively into a stripe shape except for the areas of said semiconductor layers in which impurities are to be diffused;
   forming, on the surfaces of said semiconductor layers and said two layers, a diffusion protect film to be etched selectively with respect to said insulation film;
   diffusing thermally an impurity from said first impurity diffusion source film;
   etching selectively said diffusion protect film with respect to said insulation film; and
   diffusing a second impurity with said insulation film as a mask.

2. A method of manufacturing a semiconductor laser device as set forth in claim 1, wherein said two layers consisting of said first impurity diffusion source film and said insulation film are removed respectively into a stripe shape by means of etching with a resist as a mask.

3. A method of manufacturing a semiconductor laser device as set forth in claim 1, wherein said two layers consisting of said first impurity diffusion source film and said insulation film are removed respectively into a stripe shape by means of lift-off.

4. A method of manufacturing a semiconductor laser device, said method comprising the steps of:
   providing an insulation film having an improved etching property with respect to a specific etchant on top of a diffusion material layer forming part of a layers laminated assembly in a step of heating and diffusing said diffusion material layer, said assembly including a semiconductor substrate, a first clad layer, an active layer interposed between a pair of optical waveguide layers, a second clad layer, and said diffusion material layer;
   removing the partial areas of said insulation film and said diffusion material layer selectively;
   providing a diffusion preventive film on top of said insulation film and said removed areas;
   heating and diffusing the diffusion material of said diffusion material layer to said layers laminated assembly; and,
   etching and removing said diffusion preventive film by use of said specific etchant.

5. A method of manufacturing a semiconductor laser device as set forth in claim 4, further comprising a step of diffusing a second diffusion material to said layers laminated assembly after completion of said etching removal.

6. A method of manufacturing a semiconductor laser device as set forth in claim 4, wherein said layers laminated assembly is formed of an Al—Ga—As system material, said diffusion material layer is formed of silicone, said insulation film is formed of $Si_3N_4$, and said specific etchant is formed of buffered fluoric acid including ammonium fluoride.

7. A method of manufacturing a semiconductor laser device as set forth in claim 5, wherein said second diffusion material is zinc.

8. A semiconductor laser device, comprising:
   a first electrode;
   a GaAs system substrate put on top of said first electrode;
   an Al—Ga—AS system first clad layer put on top of said substrate;
   an Al—Ga—AS system first optical waveguide layer put on top of said first clad layer;
   a GaAs system active layer put on top of said first optical waveguide layer;
   an Al—Ga—AS system second optical waveguide layer put on top of said active layer;
   a second clad layer put on top of said second optical waveguide layer;
   a GaAs system contact layer put on said second clad layer;
   a plurality of Si layers formed divisionally on top of said contact layer;
   an insulation film formed of a $Si_3N_4$ film and put on top of said Si layers; and,
   a second electrodes formed on top of said insulation film, wherein said Al—Ga—AS system first clad layer, said Al—Ga—AS system first optical waveguide layer, said GaAs active layer, said Al—Ga—AS system second optical waveguide layer, and said GaAs system contact layer respectively include therein a light confining area alloy by Si atoms diffused from said plurality of Si layers, and said GaAs system contact layer and said second clad layer respectively include therein a current confining area which is connected in a pn junction manner.

* * * * *

UNITED STATES PATENT AND TRADEMARK OFFICE
CERTIFICATE OF CORRECTION

PATENT NO. : 5,394,425
DATED : February 28, 1995
INVENTOR(S) : Hideki FUKUNAGA et al It is certified that error appears in the above-indentified patent and that said Letters Patent is hereby corrected as shown below:

Claim 8, Column 8, Line 56, "electrodes" should read --electrode--.

Signed and Sealed this

Thirteenth Day of June, 1995

Attest:

BRUCE LEHMAN

Attesting Officer

Commissioner of Patents and Trademarks